(12) United States Patent
Jain et al.

(10) Patent No.: US 9,501,597 B2
(45) Date of Patent: Nov. 22, 2016

(54) ELIMINATION OF ILLEGAL STATES WITHIN EQUIVALENCE CHECKING

(71) Applicant: Synopsys, Inc., Mountain View, CA (US)

(72) Inventors: Himanshu Jain, Portland, OR (US); Carl Preston Pixley, Beaverton, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/329,494

(22) Filed: Jul. 11, 2014

(65) Prior Publication Data

US 2016/0012167 A1    Jan. 14, 2016

(51) Int. Cl.
*G06F 9/455* (2006.01)
*G06F 17/50* (2006.01)

(52) U.S. Cl.
CPC ................ *G06F 17/5045* (2013.01)

(58) Field of Classification Search
USPC ........................................ 716/107
See application file for complete search history.

(56) References Cited

U.S. PATENT DOCUMENTS

| | | |
|---|---|---|
| 7,343,575 B2 | 3/2008 | Bjesse et al. |
| 7,890,894 B2 | 2/2011 | Bjesse et al. |
| 8,001,498 B2 | 8/2011 | Bjesse |
| 8,104,000 B2 | 1/2012 | Bjesse |
| 8,122,403 B2 * | 2/2012 | Baumgartner et al. ....... 716/107 |
| 2005/0043935 A1* | 2/2005 | Dreschsler et al. ............ 703/13 |
| 2008/0134114 A1 | 6/2008 | Bjesse et al. |
| 2010/0077366 A1 | 3/2010 | Bjesse |

OTHER PUBLICATIONS

Case, Michael L., Alan Mishchenko, and Robert K. Brayton. "Automated extraction of inductive invariants to aid model checking." Formal Methods in Computer Aided Design, 2007. FMCAD'07. IEEE, 2007.
Bradley, Aaron R. "SAT-based model checking without unrolling." Verification, Model Checking, and Abstract Interpretation. Springer Berlin Heidelberg, 2011.
Burch, Jerry R., et al. "Symbolic model checking: 10 20 states and beyond." Logic in Computer Science, 1990. LICS'90, Proceedings., Fifth Annual IEEE Symposium on e. IEEE, 1990.
Sudipta Kundu, Equivalence Checking Using Structural Analysis on Data Flow Graphs, U.S. Appl. No. 13/903,967, filed May 28, 2013.

* cited by examiner

*Primary Examiner* — Eric Lee
(74) *Attorney, Agent, or Firm* — Adams Intellex, PLC

(57) ABSTRACT

A method for equivalence checking includes obtaining a first and a second representation for a semiconductor design and applying a set of inputs to both representations. The outputs of the first representation are compared to the outputs of the second representation. If a mismatch is found, the starting states for the first and second representations are evaluated using a model checker to see if they are reachable from a known legal state such as reset state for that representation. If both of the starting states are reachable, the mismatch is a real mismatch providing a counter-example of the equivalence of the two representations. If one or both of the starting states are unreachable, the mismatch is a spurious mismatch and the model checker can be used to generate an invariant to preclude those starting states in future iterations of the equivalence checker.

33 Claims, 7 Drawing Sheets

ELIMINATION OF ILLEGAL STATES WITHIN EQUIVALENCE CHECKING

FIELD OF ART

This application relates generally to semiconductor circuit design and more particularly to equivalence checking for formal verification.

BACKGROUND

Electronic systems have grown in complexity over the years. Modern electronic systems are often built from tens or even hundreds of millions of transistors, which make them difficult and expensive to design and validate. The market also drives an ever-increasing demand for performance, advanced feature sets, system versatility, and a variety of other rapidly changing system requirements. Competing demands often introduce contradictory design requirements into the design process. System designers are required to make significant tradeoffs in performance, physical size, architectural complexity, power consumption, heat dissipation, fabrication complexity, and cost, to name a few, to try to best meet the design requirements. Each design decision exercises a profound influence on the resulting electronic system. To handle such electronic system complexity, designers create specifications around which to design their electronic systems. The specifications attempt to balance the many disparate demands being made of the electronic systems in order to contain the exploding design complexity.

Logic system designers develop the needed system specification to which proposed designs must conform. Comparison of proposed designs to the specification helps ensure that the designs meet critical system objectives. This process of comparison is called verification. Logic systems are often described at a variety of levels of abstraction, from low-level transistor layouts to high-level description languages. Most designers describe and design their electronic systems at a high-level of abstraction using an IEEE Standard hardware description language (HDL) such as Verilog™, SystemVerilog™, or VHDL™, as a high-level HDL is often easier for designers to understand, especially for a vast system, and can describe highly complex concepts that are difficult to grasp using a lower level of abstraction. The HDL description can later be converted into any of numerous other levels of abstraction as desired by the developers. For example, a high-level description can be converted to a logic-level description such as a register-transfer language (RTL), a gate-level (GL) description, a layout-level description, or a mask-level description. Each lower level of abstraction introduces more detail into the design description.

Many of the steps in a design automation chain can be deemed to be correct by construction. That is, the lower-levels of abstraction are generated automatically by computer, derived from a design library, or created by another design automation technique. For example, the generation of a gate-level description from a logic-level description can be easily verified as being equivalent due to a one-to-one correspondence between a construct in the RTL and a set of gates in the gate level description. But other steps are more difficult to verify. In some cases, a section of the design is hand-designed to optimize for certain parameters, and there is not necessarily a one-to-one correspondence between two different abstractions of the design. In other cases, the complexity is such that the automated tool cannot easily verify that a design's output is equivalent to its input. Even without correct-by-construction verification available, the resulting lower-level designs still must be capable of matching the requirements of the system specification and provide the equivalent logic function.

SUMMARY

A design analysis includes obtaining a first and a second representation for a semiconductor design and applying a set of inputs to the both representations. The outputs of the first representation are then compared to the outputs of the second representation. If a mismatch is found, the starting state for the first representation and the starting state for the second representation are evaluated using a model checker to see if they are reachable from a known legal state for that representation. If both of the starting states are reachable, the mismatch is a real mismatch providing a counter-example of the equivalence of the two representations. If one or both of the starting states are unreachable, the mismatch is spurious mismatch and the model checker can be used to generate an invariant to preclude those starting states in future iterations of the equivalence checker. A computer-implemented method for design analysis is disclosed comprising: obtaining a first representation and a second representation for a semiconductor design; applying a set of inputs to the first representation and the set of inputs to the second representation of the semiconductor design; comparing outputs of the first representation and outputs of the second representation, based on the set of inputs that were applied, to look for mismatch between the outputs of the first representation and the outputs of the second representation; and in response to detecting a mismatch, evaluating a starting point for the first representation to determine whether the starting point for the first representation is reachable. In embodiments, the method includes evaluating a starting point for the second representation to determine whether the starting point for the second representation is reachable.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Configuration Overview

Figure 1:
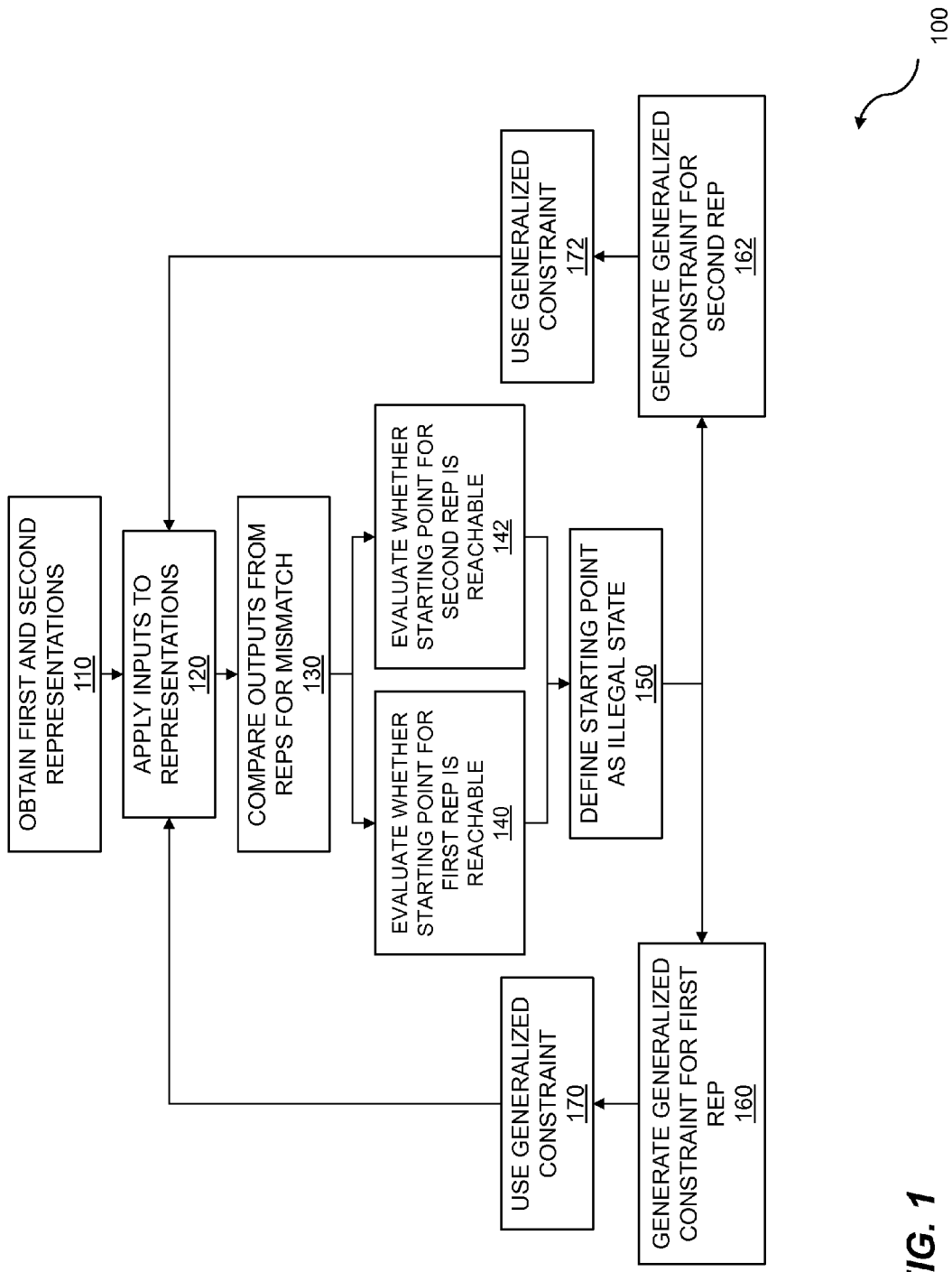
FIG. 1 is a flow diagram for using unbounded transaction equivalence.

Formal verification can refer to a mathematical technique that proves or disproves properties about a given design or designs. Formal verification includes various techniques such as model checking and equivalence checking. These techniques prove properties for all possible legal inputs or produce a counterexample to show how a property is falsified. Equivalence checking is a formal verification technique that shows that two designs are equivalent with respect to some notion of equivalence. Some common notions of equivalence include cycle-accurate equivalence where we want to show that two designs always produce same outputs when given same sequence of inputs in every clock cycle. Another notion of equivalence is transaction equivalence that checks if two design representations are equivalent with respect to a specified transaction. In transaction equivalence checking, the same transaction is executed in two different representations of a design by applying the same inputs to the two representations to see if the same outputs are generated. One advantage of transaction equivalence checking is that the two design representations being compared can be at very different levels of abstraction with different timings. For example, a floating point multiplication function in an untimed golden C++ model of a design can be compared with a pipelined register transfer language (RTL) implementation. Cycle accurate notion of equivalence is a special case of transaction level notion of equivalence where the transaction is a single cycle.

However, one problem plaguing transaction equivalence checking is the finding of false non-equivalence results, resulting from one of the design representations starting the equivalence checking process with a starting state that is not a legal state for the design. That is to say, the starting state of the representation is a state that the actual physical design could never reach. One way of avoiding these false non-equivalence results is to identify a complete set of legal states for both design representations, and then to check to make sure that the starting state of each representation is within the set of legal states. Unfortunately, identifying the complete set of legal states is very compute intensive, especially given the ever-expanding complexity of modern designs. Methods, computer program products, and systems are described herein that avoid false non-equivalence results in a much more computationally efficient manner.

In embodiments, a transaction equivalence check is performed with both design representations in completely arbitrary starting states. If the equivalence check succeeds in producing the same result at the output of both representations, the design representations are proven to be equivalent for the transaction. If, however, the equivalence check fails and the two representations output different values, the different outputs could be due to a true non-equivalence of the design representations or due to one or both of the design representations having a transaction starting state that is not in the set of legal states for the design, causing a spurious failure of the equivalence check. We use the term "starting" state to refer to the state in which a transaction starts in a given design. The starting state can be any state in the state space of a design (it is not required to be initial/reset state).

To determine whether the equivalence check failure is due to a true non-equivalence of the design representations or simply an illegal starting state, a model checker is used to determine if the starting states of the design representations are legal states. A state is legal if it is reachable from known set of legal states and satisfies all constraints provided by a user. If both design representations are deemed to have started in a legal state, then the transaction equivalence check has generated a true counter-example showing that the two design representations are not equivalent with respect to that transaction.

If either of the two design representations starts in a state that is not legal, the model checker is then used to provide a generalized constraint that can be used to eliminate that particular illegal state and, in most cases, remove some other illegal states as well. The new constraint is then added as a model assumption and the transaction equivalence check is rerun.

The techniques described herein require much less computational power than computing the complete set of legal starting states for each design. The only times that a state is checked for legality is in the situation of non-equivalent outputs from the two representations, a situation which typically represents only a small subset of all possible states. Furthermore, addition of a generalized constraint based on an illegal state can allow eliminating a many illegal states at once. In other words, currently disclosed is a demand-driven computational model which allows for automatic removal of spurious mismatches due to illegal states, unlike traditional equivalence checking where this has to be done manually. Debugging mismatches in transaction equivalence proofs can prove easier because in at least some embodiments the state transitions from the reset state to the starting states of the failing counter-example for each design representation are known. In some embodiments, constraints written as SystemVerilog™ assertions for model checking can be used inside of an equivalence checker without being rewritten.

In one case, the transaction equivalence checking tools formally use a particular transaction for the semiconductor design to check for equivalence between a specification-level representation of the design and an implementation-level representation of the design. A set of inputs is generated for the particular transaction and then those inputs are applied to both the specification-level representation and the implementation-level representation. The transaction equivalence checking tool then checks to make sure that the outputs of the specification-level representation and the implementation-level representation are the same in response to the set of inputs for the particular transaction.

In the past, systems using transaction equivalence checking may have had to generate a full list of legal states that could be used to check the starting states of the specification-level representation and the implementation-level representation before applying the set of inputs for the particular transaction. Alternatively, in some existing systems, the starting states for formal verification are limited to a small set of known good states. However, such a limitation could lead to a less robust verification. To continue, traditional equivalence checking cannot use illegal states as the starting states as they can generate spurious mismatch results and traditional systems provide no way of determining if the mismatch is a true mismatch due to non-equivalence of the specification-level representation and the implementation-level representation or a spurious mismatch due to illegal starting states.

As a contrast, the methods, computer programs, and systems described herein allow the transaction start states to be any arbitrary state constrained by a set of generalized constraints which can be based on invariants. In some cases, there might not be any generalized constraints on the starting states during the first pass through the transaction equivalence checker, with new generalized constraints being added during the course of additional iterations through the transaction equivalence checker. The set of generalized constraints, over approximate the reachable set of states, however, they may include some illegal states, rendering it possible that some of the starting states are both consistent with the generalized constraints and still illegal states. So, if a mismatch of the outputs is found, the question remains whether the mismatch is due to true non-equivalence of the specification-level representation and the implementation-level representation or to an illegal starting state.

To provide an answer, a model checker is invoked to determine if the starting state of the specification-level representation and the starting state of the implementation-level representation are reachable from the reset state of each design. If the model checker determines that both the starting state of the specification-level representation and the starting state of the implementation-level representation are reachable from the reset state, then a true non-equivalence between the specification-level representation and the implementation-level representation has been found and a counter-example to equivalence can be presented, including the starting state of the specification-level representation and the starting state of the implementation-level representation, along with the set of inputs for the particular transaction.

If, however, the starting state of the specification-level representation is not reachable from the reset state, it follows that the starting state of the specification-level representation is an illegal state from which to start the particular transaction for the specification-level representation. The model checking algorithm can then be used to provide a generalized constraint that evaluates false for that starting state of the specification-level representation and, in many cases, at least some other illegal states as well. The generalized constraint is added as an assumption for the transaction equivalence checker to eliminate the reproduction of the illegal starting state or states in further iterations of the transaction equivalence checker. Similarly, if it is found that the starting state of the implementation-level representation is not reachable from the reset state, the starting state of the implementation-level representation is an illegal state from which to start the particular transaction for the implementation-level representation. The model checking algorithm can then be used to provide a generalized constraint that evaluates false for that starting state of the implementation-level representation and, in many cases, at least some other illegal states as well. This generalized constraint is added as an assumption for the transaction equivalence checker to eliminate the reproduction of the illegal starting state or states in further iterations of the transaction equivalence checker.

During transaction equivalence check instead of generating the starting states randomly such as for a constrained random stimulus technique, the starting states can be generated using symbolic techniques. This involves representing the starting state and inputs applied during transaction as symbolic variables. Next, the output of each design is expressed as a function of inputs applied during the transaction and the starting state. The output expression for each design is then compared under the given constraints using solvers such as binary decision diagram (BDD) solvers or Boolean satisfiability problem (SAT) solvers. If the outputs are proved to be equal, then it means that the two designs are equivalent with respect to the transaction. However, if the output comparison fails, the solvers produce a counterexample that assigns Boolean values to the inputs and starting state variables. The symbolic techniques allow manipulation of mathematical (here Boolean) expressions including simplification of expressions, substitution of symbols, and the change of form of expressions. The BDD solver can be used to represent a Boolean function as a directed acyclic graph. Reduction rules can be applied to reduce the graph complexity and to assist in functional equivalence checking. The SAT solver can be used to determine whether the variables of a given Boolean function can be assigned so that the function can evaluate to a logic true value. If no such assignment exists, then the Boolean function is identically logical false.

When the transaction equivalence check fails we need to check if the starting state of the transaction is reachable from a set of legal states such as reset (initial) states. A state is considered reachable from an initial state (or initial set of states) if there is a path in the state transition graph of the circuit starting from an initial state to the that state. A simple but unrealistic procedure to check if a state is reachable is to build the state transition graph of the circuit and then use a standard graph based algorithm such as a shortest path algorithm. This approach is impractical because the number of states in the state transition graph is exponential with respect to the number state elements. Therefore, it is not possible to explicitly construct the state transition graph. As stated, a common solution to this problem is to use symbolic reachability analysis techniques based on BDDs or Boolean satisfiability solvers. The state sets and transition relations are represented as formulas using canonical forms such as BDDs or Boolean formulas. The symbolic methods traverse the state space more efficiently by considering large numbers of states at a single step instead of enumerating reachable states one at a time This iterative process between the transaction equivalence checker and the model checker can continue until a real counter-example of equivalence is found, the equivalence of the two models for the particular transaction is proved, or certain resource limits are exhausted.

Further Details

FIG. 1 is a flow diagram 100 for using transaction equivalence. The flow 100 describes a computer-implemented method for design analysis and includes obtaining a first representation and a second representation 110 for a semiconductor design. The first and second representation can each be any type of design representation, including, but not limited to, a functional description written in a computer language such as C++; a representation in a hardware description language (HDL) such as Verilog, SystemVerilog or VHDL; a logic-level description such as a register-transfer language (RTL); a symbolic description such as a schematic; a logical description such as net-list; a gate-level (GL) description; a layout-level description; or a mask-level description. In some embodiments, the first representation and the second representation of the semiconductor design are at different levels of abstraction. The first representation can include a specification design, such as a functional description of an HDL description, and the second representation can include an implementation design. The representations can be obtained by any method, including, but not limited to, retrieving one or more files from a computer readable storage medium such as a hard disk drive, receiving data over a computer network, passing data structures in memory between electronic computer-aided design (ECAD) tools, data entry by a human, or any other means of obtaining a design representation by a computer.

The flow 100 continues by applying a set of inputs to the first representation and the set of inputs to the second representation 120 of the semiconductor design. In some embodiments, the set of inputs represents a transaction for the design or an operation. Depending on the embodiment, the set of inputs can be presented simultaneously or sequentially and can include a single value for a single input or a sequence of values for a single input. In some embodiments the inputs are applied symbolically, that is, instead of applying specific input values, all input values are considered at once. At the time that the set of inputs are applied to the two representations, each representation has a starting state in which the transaction is started. In at least some embodiments, the first representation starts in an arbitrary state, and the second representation can start in an arbitrary state as well. In some embodiments, the starting states, are constrained using a set of constraints or assumptions. The set of constraints constrain the set of starting states, however, it is still possible that an illegal state is consistent with the current set of constraints. As an example, if a particular three-bit register in the design can only have the values of 1, 5 or 7, a possible constraint on the system might be prohibiting even values on the register. This constraints eliminates illegal states where the register value is 0, 2, 4, or 6. However, this constraint is consistent with register having a value of 3 which represents an illegal state.

The flow 100 also includes comparing outputs of the first representation and outputs of the second representation, based on the set of inputs that were applied, to look for a mismatch 130 between the outputs of the first representation and the outputs of the second representation. The applying of the set of inputs and the comparing of the outputs of the first representation and the outputs of the second representation can comprise transaction equivalence checking. If a mismatch is found, it could be due to a non-equivalence of the two representations of the design, or due to one or both of the representations having an illegal starting state. So, in response to detecting a mismatch, the flow 100 includes evaluating a starting point for the first representation to determine if the starting point for the first representation is reachable 140. The flow 100 can also include evaluating a starting point for the second representation to determine whether the starting point for the second representation is reachable 142.

In embodiments, a starting point of one of the representations is evaluated using a model checker to determine if the starting state can be reached from a known good state, such as the reset state. Because using the model checker to check to see if an arbitrary state can be reached from a known good state is a computationally intensive task, minimizing the number of times that the model checker is used can decrease the amount of computation that is performed. In the present disclosure, the efficiency of the transaction equivalence checker can be increased by using the model checker only if there is a mismatch, instead of using the model checker to verify that every starting state generated is legal.

If it is found that the starting state for both design representations is legal, the non-equivalence can be determined to represent a true non-equivalence and can be reported along with the counterexample generated. If, however, the starting state for at least one of the design representations is illegal (unreachable from a known good state), the counterexample is spurious and can be ignored. In this case, the starting point can be defined as an illegal state 150. But to avoid further spurious results from the newly defined illegal state, a generalized constraint is generated to eliminate the illegal state, as well as some set of other related illegal states in most cases, from consideration in subsequent loops through the equivalence checker. So, the flow 100 includes generating a generalized constraint for the starting point for the first representation 160 if the starting point for the first representation is not reachable (not legal). Using a similar process, the flow 100 can also include generating a generalized constraint for the starting point for the second representation 162 if the starting point for the second representation is not reachable (i.e. not legal). In at least some embodiments, a generalized constraint is based on an invariant. The generalized constraint can be generated using a model checker when checking the reachability of starting point from a known good state, such as the reset state.

If a generalized constraint is created it can then be used in further iterations of transaction equivalence checking. For example, if a generalized constraint is created for the first design representation 160, the generalized constraint can be used 170 to constrain starting states of the first design representation for future iterations of the transaction equivalence checking And if a generalized constraint is created for the second design representation 162, the generalized constraint can used 172 to check starting states of the second design representation for future iterations of the transaction equivalence checking. In the additional iterations, the flow 100 further comprises repeating the applying of inputs 120 and the comparing of outputs 130 using the generalized constraint(s) to constrain the starting states of the design representations. Because the generalized constraints can be generated using a model checker, in some embodiments the flow 100 further comprises iterating on the transaction equivalence checking using a model checker. In the present disclosure, the efficiency of this iterative process can be increased by using generalized constraints, as they eliminate many illegal states at once, thereby reducing the number of iterations.

Figure 2:
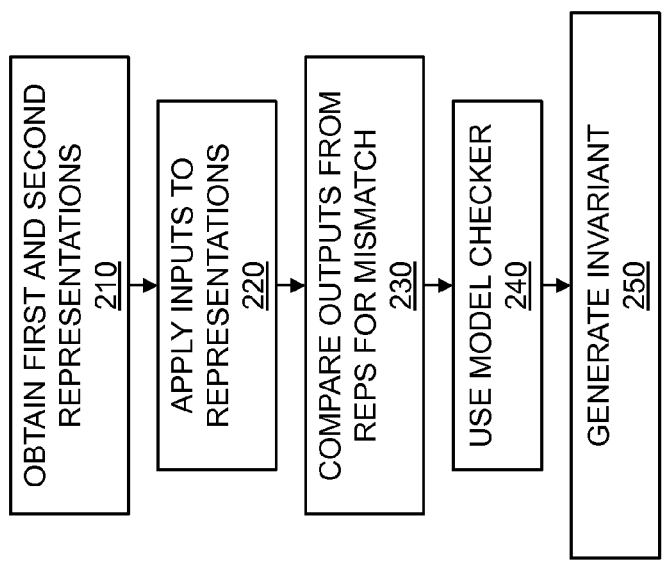
FIG. 2 is a flow diagram for generation of an invariant.

FIG. 2 is a flow diagram 200 for generation of an invariant. As was the case in flow 100 of FIG. 1, the flow 200 includes obtaining a first representation and a second representation 210 for a semiconductor design. The first and second representation can each be any type of design representation, including, but not limited to, a functional description written in a computer language such as C++; a representation in a hardware description language (HDL) such as Verilog, SystemVerilog, or VHDL; a logic-level description such as a register-transfer language (RTL); a symbolic description such as a schematic; a logical description such as net-list; a gate-level (GL) description; a layout-level description; or a mask-level description. In some embodiments, the first representation and the second representation of the semiconductor design can be at different levels of abstraction. The first representation can include a specification design, such as a functional description of an HDL design, and in some embodiments, the second representation includes an implementation design. The representations can be obtained by any method, including, but not limited to, retrieving one or more files from a computer readable storage medium such as a hard disk drive, receiving data over a computer network, passing data structures in memory between electronic computer-aided design (ECAD) tools, data entry by a human, or any other means of obtaining a design representation by a computer.

The flow 200 continues by applying a set of inputs to representations 220 of the semiconductor design. In some embodiments, the set of inputs represents a transaction for the design or an operation. Depending on the embodiment, the set of inputs can be presented simultaneously or sequentially and can include a single value for a single input or a sequence of values for a single input. At the time that the set of inputs are applied to the representations, each representation is in a starting state. In at least some embodiments, one or both of the representations start in an arbitrary state. In some embodiments, starting points are pre-evaluated against a set of constraints to verify that neither of the starting states is inconsistent with those constraints.

The flow 200 also includes comparing outputs of the two representations to look for mismatch 230 between the outputs of the representations. If a mismatch is found, the mismatch could be due to a true non-equivalence of the two representations of the design, but the mismatch could also be due to one or both of the representations having an illegal starting state. So, in response to detecting a mismatch, the flow 200 includes using a model checker 240 to evaluate a starting point for one or both of the representations to determine if the starting point(s) are reachable. If a starting point is found to be reachable, the starting point can be deemed legal. If a starting point is found to be unreachable, the starting point can be deemed illegal. Thus, the evaluating the starting point for the first representation and the evaluating the starting point for the second representation can be accomplished by a model checker.

The flow 200 can further comprise generating an invariant 250 for the first representation or the second representation. The invariant is a property that holds in every reachable state of the design and does not hold in the unreachable state found in 230. An invariant can be produced by a model checker when showing unreachability of a given state. Some model checking algorithms produce inductive invariants. An invariant is inductive if it can be proved by simple induction or temporal induction using only a 1-step (current state, next state) model. If an invariant exists to demonstrate that a given state is unreachable, then the counter-example generated when the unreachable state is set as the starting state of one of the representations of the design is spurious, and the non-equivalent result can be ignored. The invariant can be expressed as a generalized constraint in at least some embodiments.

That is, the invariant can be used to constrain starting points of the first and/or second representation of the design for additional iterations of transaction equivalence checking By generating inductive invariants for discovered illegal starting states, and avoiding starting states that are inconsistent with those inductive invariants for additional iterations of transaction equivalence checking, the efficiency of the equivalence checking can be exponentially increased because in each iteration it becomes less and less likely that an illegal starting state that is consistent with the existing set of inductive invariants will be found. Further, the model checker need not be invoked for those starting states that are found by the equivalence checking to generate equivalent results.

Figure 3:
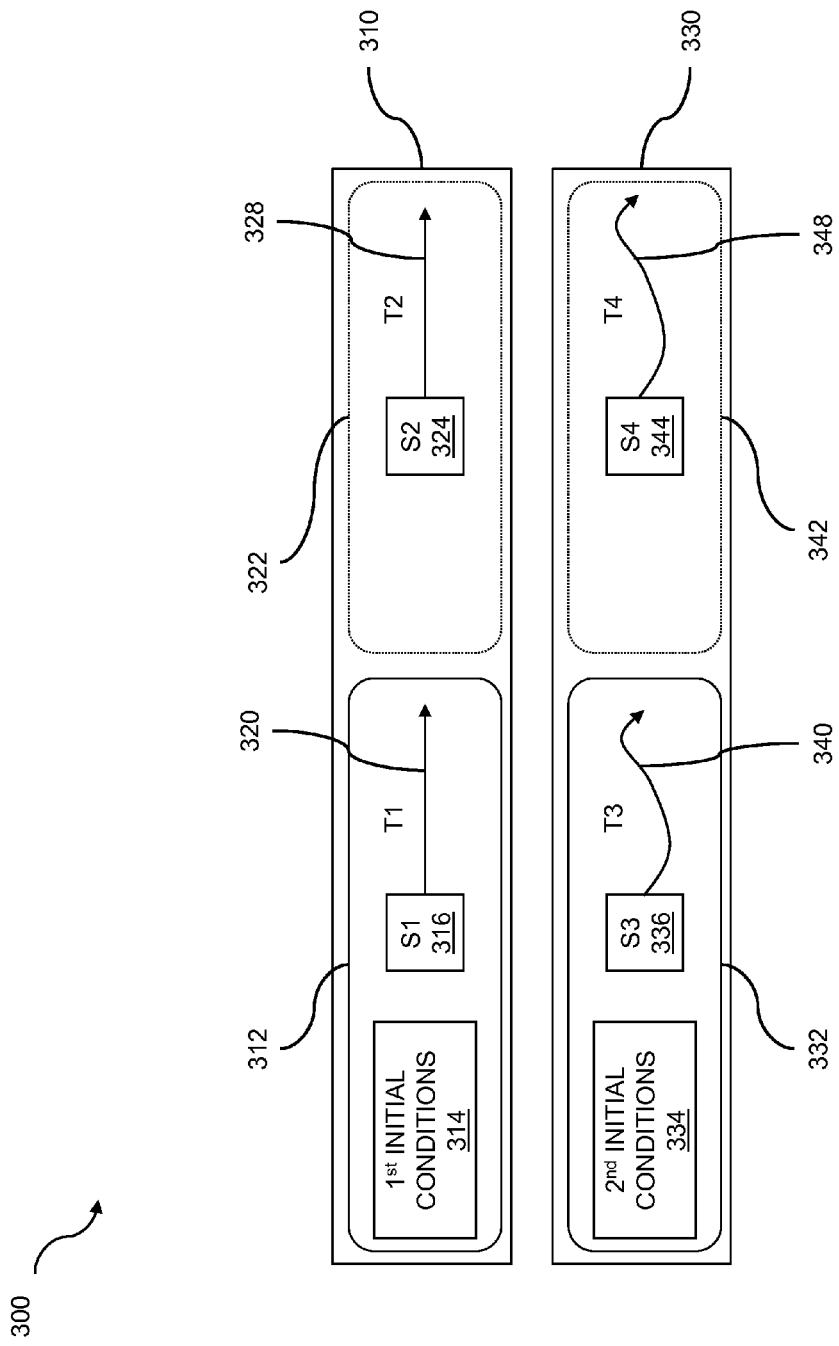
FIG. 3 shows example transactions from reachable and unreachable states.

FIG. 3 shows example transactions 300 from reachable and unreachable states. Two different design representations are symbolized by rectangles, with the first design representation symbolized by a first rectangle 310 and the second design representation symbolized by a second rectangle 330. Each design representation can have a starting state that is either a legal state or an illegal state. In at least some embodiments, a legal state is a state that can be reached using an allowable set of inputs, including sequential sets of inputs, from a reset state. An illegal state can be defined as a state that cannot be reached from the reset state using any allowable set of inputs, including sequential sets of inputs, from a reset state. An allowable set of inputs can be defined as a set of inputs that is consistent with any constraints or assertions for the inputs for a given design. In the diagram 300, the first representation 310 has legal states 312 which are reachable from the first initial conditions 314 and illegal states 322 which are not reachable from the first initial conditions 314. The second representation 330 has legal states 332 which are reachable from the second initial conditions 334 and illegal states 342 which are not reachable from the second initial conditions 334.

The first set of initial conditions 314 represents a set of states for the first design representation 310 that are known to be valid, such as a reset state. The second set of initial conditions 334 is a set of states for the second design representation 320 that are known to be valid, such as a reset state. If the first design representation 310 has a starting state S1 316 that is in the set of legal states 312, then any set of inputs for a transaction T1 320 will generate a state for the first design representation 310 that is still within the set of legal states 312 for the first representation. But if the first design representation 310 has a starting state S2 324 that is in the set of illegal states 322, then a set of inputs for the transaction T2 328 can cause the first design representation 310 to go into a state that could be in either the set of legal states 312 or the set of illegal states 322. Similarly, if the second design representation 330 has a starting state S3 336 that is in the set of legal states 332, then any set of inputs for a transaction T3 340 will generate a state for the second design representation 330 that is still within the set of legal states 332 for the second representation. But if the second design representation 330 has a starting state S4 344 that is in the set of illegal states 342, then a set of inputs for the transaction T4 348 can cause the second design representation 330 to go to a state that could be in either the set of legal states 332 or the set of illegal states 342.

In embodiments, a model checker is used to determine if a particular state can be reached from a known good state. For example, a model checker could be used to see if the state S1 316 can be reached from the first initial conditions 314. Since the state S1 316 is in the set of legal states 312, the model checker will return an indication that there is a valid set of inputs that can cause the state of the first representation 310 to transition from a state in the first initial conditions 314 to the state S1 316. So, evaluating the starting point for the first representation can determine if the starting point is a legal state. Starting states for the first representation and the second representation may be generated as part of a formal verification process.

The model checker could also be used to see if the state S2 324 can be reached from the first set of starting states 314. Since the state S2 324 is in the set of illegal states 322, the model checker will return an indication that there is no set of inputs that can cause the state of the first representation 310 to transition from a state in the first set of initial conditions 314 to state S2 324. The model checker can be similarly used on the second representation 330 to determine that the state S3 336 is reachable from the second set of initial conditions 334 but that the state S4 344 is not reachable from the second set of initial conditions 334. So, some embodiments include evaluating a starting point for the second representation to determine if the starting point for the second representation is reachable.

Figure 4:
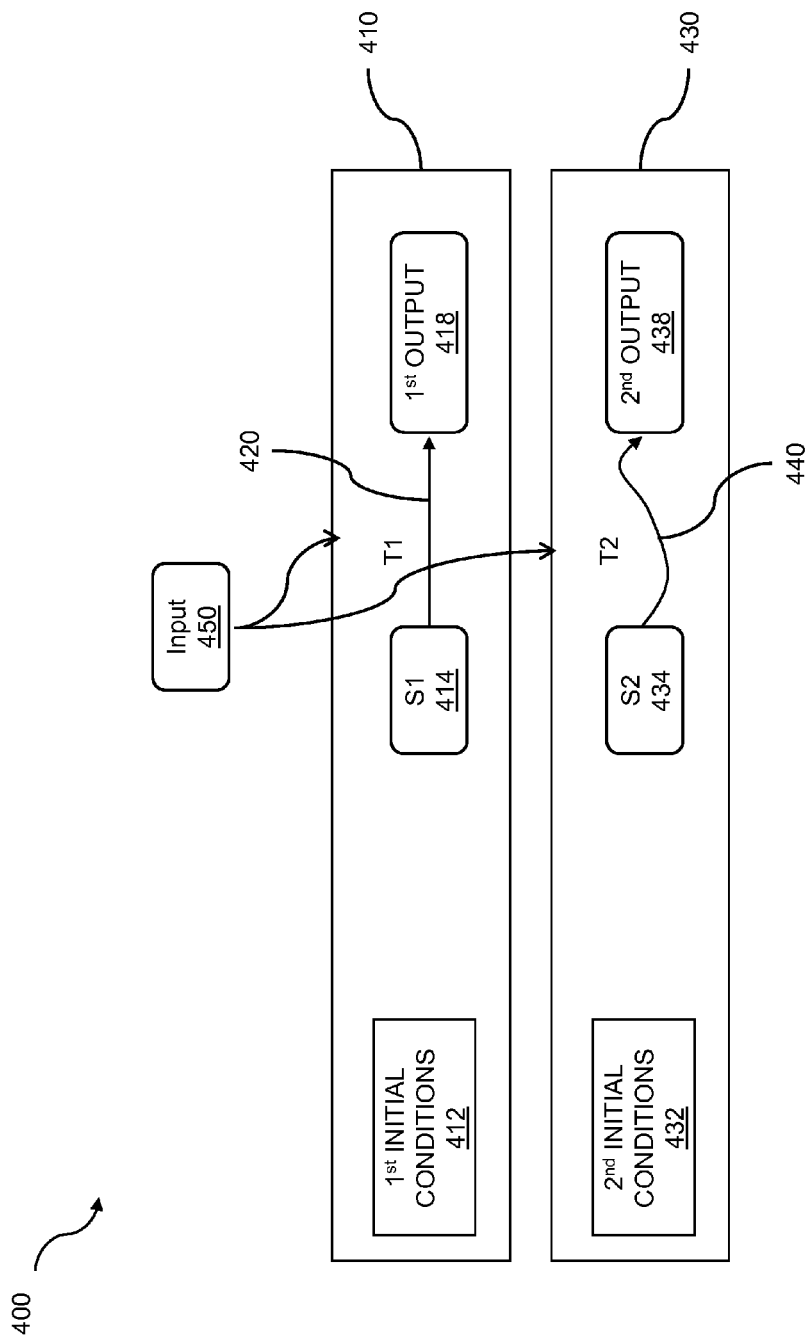
FIG. 4 is an example of transaction equivalence checking.

FIG. 4 is an example 400 of transaction equivalence checking. The example 400 includes a first representation of a semiconductor design 410 and a second representation 430 of a semiconductor design. The two representations can be any type of representations and can be at different levels of abstraction, such as a specification-level representation and an implementation-level representation in some cases. The first representation 410 has a first set of initial conditions 412 which defines a list of one or more known legal states for the first representation 410. The second representation 430 has a second set of initial conditions 432 which defines a list of one or more known legal states for the second representation 430.

At the initiation of the transaction equivalence checking, the first representation 410 has a starting point S1 414 and the second representation 430 has a starting point S2 434. In some embodiments, point S1 414 and point S2 434 are arbitrary points and can be legal states or illegal states. In some embodiments, point S1 414 and point S2 434 can be checked against one or more generalized constraints which have been previously generated by early iterations of the transaction equivalence checking. It is possible that point S1 414 and point S2 434 can be consistent with the generalized constraints and still represent illegal states.

A set of inputs 450 is applied to the first representation 410 and the set of inputs 450 is applied to the second representation 430 of the semiconductor design as a part of the example 400. The same set of inputs 450 are applied to both representations. The application of the inputs causes the first representation 410 to go through a transaction T1 420 to generate a first set of outputs 418 and the second representation 430 to go through a transaction T2 440 to generate a second set of outputs 438.

In the example 400 of transaction equivalence checking, the first set of outputs 418 is compared to the second set of outputs 438 to see if they match. If the two sets of output match, equivalence for the transaction represented by the input 450 is verified, independent of whether or not the starting points, point S1 414 for the first representation 410 and point S2 434 for the second representation 430, were in legal states or not. If the two sets of output match, the model checker is not invoked, saving significant computational resources and increasing the efficiency of the transaction equivalence checking tool. In some embodiments, the inputs/outputs are represented symbolically and outputs are mathematical functions of inputs, if the output expressions are show to be equivalent, then the equivalence checker has successfully proven that the two designs are equivalent with respect to the transaction of interest.

Figure 5:
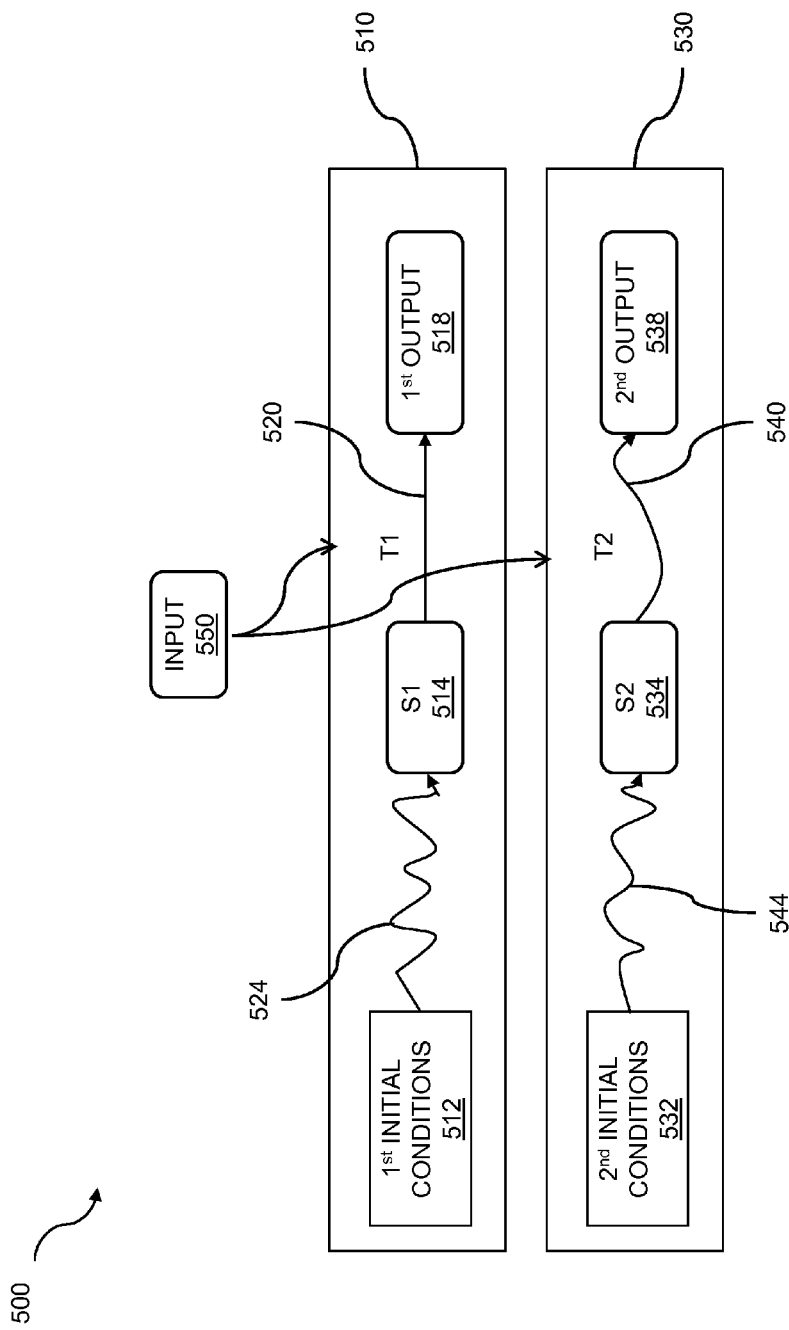
FIG. 5 is an example diagram for output mismatch comparison.

FIG. 5 is an example diagram 500 for output mismatch comparison. The example 500 includes a first representation of a semiconductor design 510 and a second representation 530 of a semiconductor design. The two representations can be any type of representations and can be at different levels of abstraction, such as a specification-level representation and an implementation-level representation in some cases. The first representation 510 has a first set of initial conditions 512 which defines a list of one or more known legal states for the first representation 510. The second representation 530 has a second set of initial conditions 532 which defines a list of one or more known legal states for the second representation 530.

At the start of the transaction equivalence checking, the first representation 510 has a starting point S1 514 and the second representation 530 has a starting point S2 534. In some embodiments, point S1 514 and point S2 54 are arbitrary and can be legal states or illegal states. In some embodiments, point S1 514 and point S2 534 can be checked against one or more generalized constraints that have been previously generated by early iterations of the transaction equivalence checking. It is possible for points S1 514 and S2 534 to be consistent with the generalized constraints and still represent illegal states.

A set of inputs 550 is applied to the first representation 510 and the set of inputs 550 is applied to the second representation 530 of the semiconductor design as a part of the example 500. The same set of inputs 550 is applied to both representations. The application of the inputs causes the first representation 510 to go through a transaction T1 520 to generate a first set of outputs 518 and the second representation 530 to go through a transaction T2 540 to generate a second set of outputs 538.

In the example 500, the first set of outputs 518 is compared to the second set of outputs 538 to see if they match. If the two sets of outputs do not match, the mismatch can be due to either a true non-equivalence of the two representations, or due to at least one of the two starting points S1 514 or S2 534 being an illegal state. In embodiments, a starting state is defined as a legal state based on determination of reachability, and the determination of reachability is based on a starting set of states that are known to be legal.

To determine whether the mismatch is due to non-equivalence of the two representations or an illegal starting point, a model checker is invoked. The model checker tries to find a path 524 from the first set of initial conditions 512 to point S1 514 for the first representation 510 and/or a path 544 from the second set of initial conditions 532 to point S2 534 where the path 524 comprises a set of inputs applied to the first representation 510 after the representation has been put into one of the first set of initial conditions 512, and the path 544 comprises a set of inputs applied to the second representation 530 after the representation has been put into one of the second set of initial conditions 532. If the model checker is able to find both the first path 524 and the second path 544, then both the starting point S1 514 for the first representation 510 and the starting point S2 534 for the second representation 530 are legal states, signifying a true mismatch and demonstrating a valid counter-example to transaction equivalence.

If, however, the model checker is unable to find the path 524, then the starting state S1 514 for the first representation 510 can be considered to comprise an illegal state and a generalized constraint, which can be based on an invariant, is generated for the first representation 510 to constrain the starting points in such a way that the state S1 514 is eliminated as a potential starting point. Likewise, if the model checker is unable to find path 544, then the starting state S2 534 for the second representation 530 can be considered to comprise an illegal state and a generalized constraint, which can be based on an invariant, is generated for the second representation 530 to constrain the starting points in such a way that the state S2 534 is eliminated as a potential starting point. In such cases where one or both paths are not found, the output mismatches are spurious mismatches and do not represent a valid indication of non-equivalence between the two representations.

Figure 6:
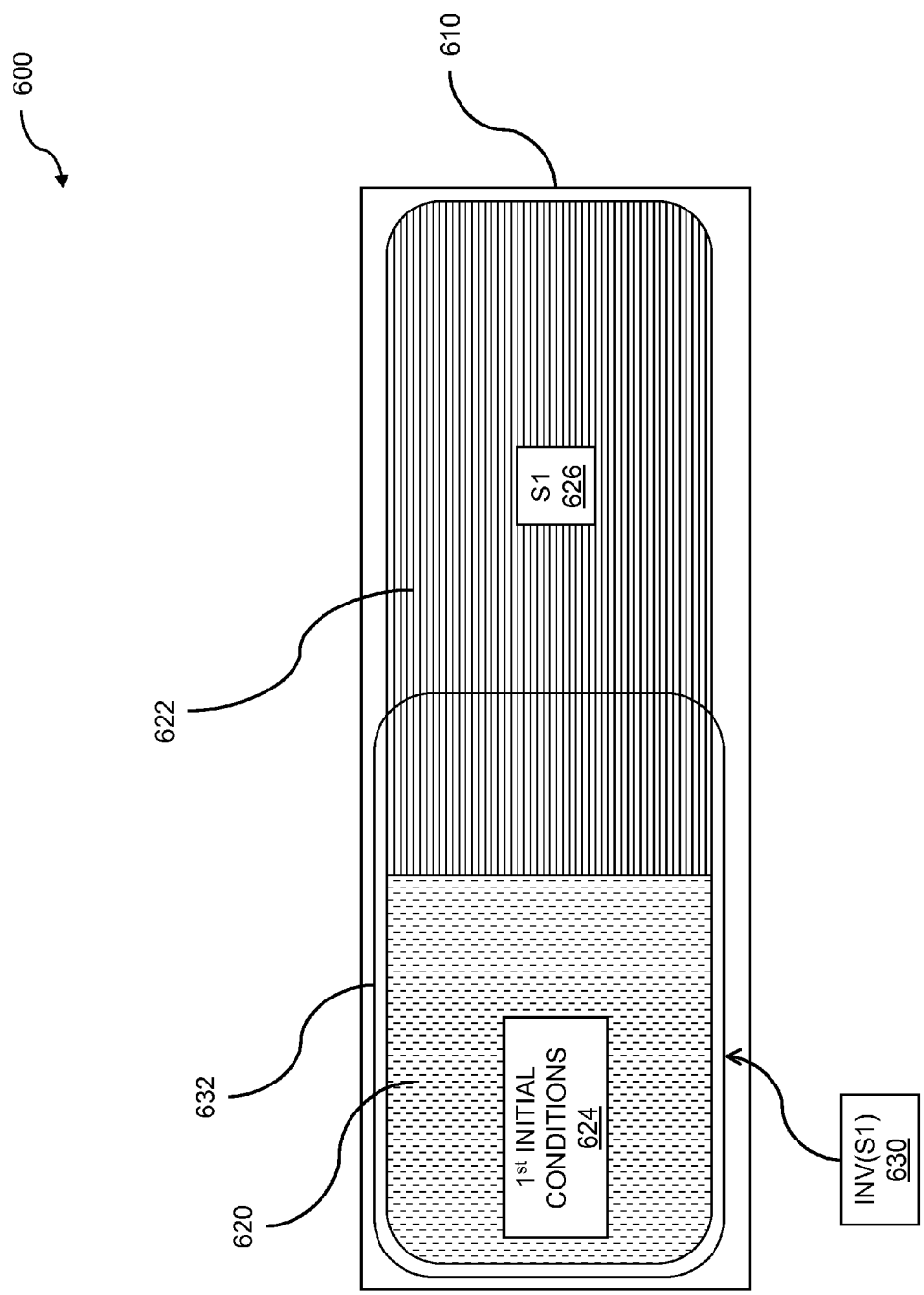
FIG. 6 is an example diagram illustrating over-approximation of reachable states using invariant.

FIG. 6 is an example diagram 600 illustrating over-approximation of reachable states. The example 600 shows a representation 610 of a semiconductor design which can be illustrative of any representation, including a first representation or a second representation, where a mismatch of outputs has been found. The representation 610 of the design has a state at any given point of time that is either in the set of legal states 620, represented by the area shaded with broken vertical lines, or in the set of illegal states 622, represented by the area shaded with horizontal lines. The set of legal states 620 is the set of states that are reachable from the first set of initial conditions 624. It should be noted that the first set of initial conditions 624 are a subset of the legal states 620.

In the example, a state S1 626 has been determined to be unreachable from the first set of initial conditions 624 by a model checker as described above. Based on its inability to find a path from the first set of initial conditions 624 to the state S1 626, the model checker generates an invariant based on S1, INV(S1) 630, that can be expressed as a generalized constraint. An invariant is a property that holds in every reachable state of the design and does not hold in the unreachable state S1 626. An invariant can be generated based on an unreachable state to identify that state as being unreachable.

INV(S1) 630 can be used to define an approximation 632 of the set of reachable states that can include a larger set of states than the actual set of reachable states 620. Thus, it can be stated that the invariant is an over-approximation set of reachable states. The over-approximation set 632 can include a subset of illegal states, as can be shown by the portion of the approximation 632 that is overlaid with horizontal lines.

The generalized constraints generated based on the inductive invariant 630 can be used to constrain starting points for the transaction equivalence checking Note that this constraint not only eliminates unreachable state S1 626 but it can eliminate many more illegal states, that is, any state outside of 630 is eliminated by this constraint. While there are still illegal states that are consistent with the inductive invariant 630, over multiple iterations fewer and fewer illegal states will be consistent with the set of generalized constraints generated, so the model checker will be invoked less and less during additional iterations through the transaction equivalence checker.

Figure 7:
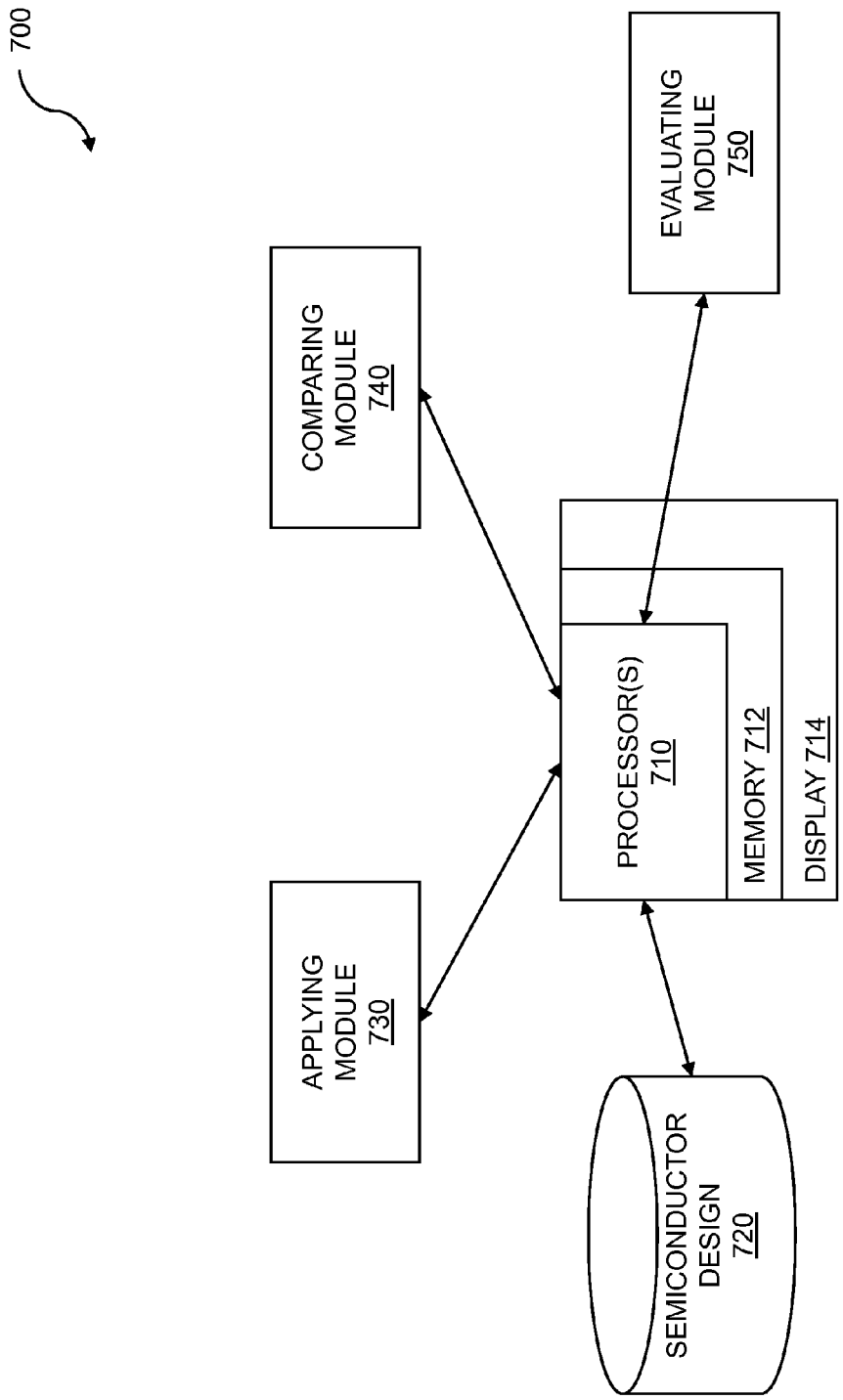
FIG. 7 is a system for performing equivalence checking.

FIG. 7 is a system 700 for performing equivalence checking. The example system 700 includes one or more processors 710 coupled to a memory 712 which can be used to store computer code instructions and/or data, design representations, generalized constraints, inductive invariants, computer code of electronic design automation programs, intermediate data, and the like. A display 714 is also included in some embodiments, and can be any electronic display, including but not limited to, a computer display, a laptop screen, a net-book screen, a tablet screen, a cell phone display, a mobile device display, a remote with a display, a television, a projector, or the like. An embodiment of a computer program running on the one or more processors 710 is able to perform equivalence checking.

The semiconductor design 720 is stored on a computer readable media, such as a hard drive, which is coupled to the one or more processors 710. The semiconductor design 720 can include one or more design representations, such as a first representation and/or a second representation. The representation(s) can be any type of design representation, including, but not limited to, a functional description written in a computer language such as C++; a representation in a hardware description language (HDL) such as Verilog, SystemVerilog or VHDL; a logic-level description such as a register-transfer language (RTL); a symbolic description such as a schematic; a logical description such as net-list; a gate-level (GL) description; a layout-level description; or a mask-level description. Representations of the semiconductor design can be obtained by the one or more processors 710 accessing the semiconductor design 720 stored on the hard drive.

An applying module 730 is included in the system 700 to apply a set of inputs to the first representation and the set of inputs to the second representation of the semiconductor design. A comparing module 740 is included in the system 700 to compare the outputs of the first representation and the outputs of the second representation, based on the set of inputs that were applied, to look for mismatch between the outputs of the first representation and the outputs of the second representation. An evaluating module 750 is included in the system 700 to evaluate a starting point for the first representation to determine whether the starting point for the first representation is reachable in response to detecting a mismatch in the outputs. In at least one embodiment, the functions of the identifying applying module 730, the comparing module 740, and the evaluating module 750 are accomplished or augmented by the one or more processors 710.

The system 700 can include a computer program product embodied in a non-transitory computer readable medium for design analysis comprising: code for obtaining a first representation and a second representation for a semiconductor design; code for applying a set of inputs to the first representation and the set of inputs to the second representation of the semiconductor design; code for comparing outputs of the first representation and outputs of the second representation, based on the set of inputs that were applied, to look for mismatch between the outputs of the first representation and the outputs of the second representation; and code for evaluating, in response to detecting a mismatch, a starting point for the first representation to determine whether the starting point for the first representation is reachable Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer program product embodied in a non-transitory computer readable medium, which when executed by a processor, causes the processor to perform design analysis, the computer program product comprising instructions that when executed cause the processor to:
    apply a set of inputs to a first representation and the set of inputs to a second representation for a semiconductor design wherein the semiconductor design is for fabrication in a semiconductor process;
    compare outputs of the first representation and outputs of the second representation, based on the set of inputs that were applied, to look for mismatch between the outputs of the first representation and the outputs of the second representation;
    evaluate in response to detecting a mismatch, a starting point for the first representation to determine whether the starting point for the first representation is reachable; and
    generate a generalized constraint for the starting point for the second representation, if the starting point for the second representation is not reachable, wherein the generalized constraint is based on an invariant that holds in every reachable state of the semiconductor design.

2. The computer program product of claim 1 that further causes the processor to evaluate a starting point for the second representation to determine whether the starting point for the second representation is reachable.

3. The computer program product of claim 2 wherein the evaluating the starting point for the first representation determines whether the starting point is a legal state.

4. The computer program product of claim 3 that further causes the processor to generate a generalized constraint for the starting point for the first representation if the starting point for the first representation is not reachable.

5. A computer system for design analysis comprising:
    a memory which stores instructions;
    one or more processors coupled to the memory wherein the one or more processors are configured to:
    apply a set of inputs to a first representation and the set of inputs to a second representation for a semiconductor design wherein the semiconductor design is for fabrication in a semiconductor process;
    compare outputs of the first representation and outputs of the second representation, based on the set of inputs that were applied, to look for mismatch between the outputs of the first representation and the outputs of the second representation;
    evaluate, in response to detecting a mismatch, a starting point for the first representation to determine whether the starting point for the first representation is reachable; and
    generate a generalized constraint for the starting point for the second representation, if the starting point for the second representation is not reachable, wherein the generalized constraint is based on an invariant that holds in every reachable state of the semiconductor design.

6. The system of claim 5 wherein the one or more processors are further configured to evaluate a starting point for the second representation to determine whether the starting point for the second representation is reachable.

7. The system of claim 6 wherein evaluation of the starting point for the first representation determines whether the starting point is a legal state.

8. The system of claim 7 wherein the one or more processors are further configured to generate a generalized constraint for the starting point for the first representation if the starting point for the first representation is not reachable.

9. The system of claim 5 further comprising a model checker, wherein the model checker is used to check if a desired state can be reached from a first set of initial conditions.

10. The system of claim 9 wherein the model checker returns an indication that there is a valid set of inputs that can cause the state of the first representation to transition from a state in the first set of initial conditions to the desired state.

11. A computer-implemented method for design analysis comprising:
applying a set of inputs to a first representation and the set of inputs to a second representation for a semiconductor design wherein the semiconductor design is for fabrication in a semiconductor process;
comparing outputs of the first representation and outputs of the second representation, based on the set of inputs that were applied, to look for mismatch between the outputs of the first representation and the outputs of the second representation;
evaluating, using one or more processors, in response to detecting a mismatch, a starting point for the first representation to determine whether the starting point for the first representation is reachable; and
generating a generalized constraint for the starting point for the second representation, if the starting point for the second representation is not reachable, wherein the generalized constraint is based on an invariant that holds in every reachable state of the semiconductor design.

12. The method of claim 11 wherein the starting point for the first representation is not reachable and the mismatch is a spurious mismatch.

13. The method of claim 11 further comprising modifying the semiconductor design based on the comparing outputs of the first representation and outputs of the second representation, based on the set of inputs that were applied, and detecting a mismatch between the outputs of the first representation and the outputs of the second representation where the mismatch is a true mismatch due to non-equivalence between the first representation and the second representation.

14. The method of claim 11 further comprising evaluating a starting point for the second representation to determine whether the starting point for the second representation is reachable.

15. The method of claim 14 wherein the evaluating the starting point for the second representation determines if the starting point is a legal state.

16. The method of claim 14 wherein the evaluating the starting point for the first representation determines whether the starting point is a legal state.

17. The method of claim 16 further comprising generating a generalized constraint for the starting point for the first representation if the starting point for the first representation is not reachable.

18. The method of claim 17 further comprising repeating the applying inputs and the comparing outputs using the generalized constraint.

19. The method of claim 14 wherein the applying the set of inputs and the comparing the outputs of the first representation and the outputs of the second representation comprise equivalence checking.

20. The method of claim 19 wherein the equivalence checking includes transaction equivalence checking.

21. The method of claim 19 further comprising iterating on the equivalence checking using a model checker.

22. The method of claim 11 further comprising repeating the applying inputs and the comparing outputs using the generalized constraint.

23. The method of claim 11 wherein the first representation starts in an arbitrary state.

24. The method of claim 11 further comprising defining a starting state as a legal state based on determination of reachability.

25. The method of claim 24 wherein the determination of reachability is from a starting set of states.

26. The method of claim 11 further comprising generating an invariant for the first representation or the second representation.

27. The method of claim 26 wherein the invariant includes an inductive invariant.

28. The method of claim 26 wherein the invariant is an over-approximation set of reachable states.

29. The method of claim 28 wherein the over-approximation includes a closed over-approximation.

30. The method of claim 11 wherein the first representation and the second representation of the semiconductor design are at different levels of abstraction.

31. The method of claim 11 wherein starting states for the first representation and the second representation are generated as part of a formal verification process.

32. The method of claim 11 further comprising using a model checker, wherein the model checker is used to check if a desired state can be reached from a first set of initial conditions.

33. The method of claim 32 wherein the model checker returns an indication that there is a valid set of inputs that can cause the state of the first representation to transition from a state in the first set of initial conditions to the desired state.

* * * * *